United States Patent
Schricker

(10) Patent No.: US 8,431,417 B2
(45) Date of Patent: Apr. 30, 2013

(54) METHODS FOR INCREASING CARBON NANO-TUBE (CNT) YIELD IN MEMORY DEVICES

(75) Inventor: April D. Schricker, Palo Alto, CA (US)

(73) Assignee: SanDisk 3D LLC, Milpitas, CA (US)

( * ) Notice: Subject to any disclaimer, the term of this patent is extended or adjusted under 35 U.S.C. 154(b) by 53 days.

(21) Appl. No.: 12/543,465

(22) Filed: Aug. 18, 2009

(65) Prior Publication Data

US 2010/0044671 A1   Feb. 25, 2010

Related U.S. Application Data

(60) Provisional application No. 61/090,222, filed on Aug. 19, 2008.

(51) Int. Cl.
  *H01L 21/00* (2006.01)
(52) U.S. Cl.
  USPC ............................................. 438/3; 977/721
(58) Field of Classification Search .................... 438/382
  See application file for complete search history.

(56) References Cited

U.S. PATENT DOCUMENTS

| | | | |
|---|---|---|---|
| 5,407,526 A * | 4/1995 | Danielson et al. | 438/693 |
| 5,915,167 A | 6/1999 | Leedy | |
| 6,952,030 B2 | 10/2005 | Herner et al. | |
| 7,176,064 B2 | 2/2007 | Herner | |
| 7,405,465 B2 | 7/2008 | Herner | |
| 7,575,984 B2 | 8/2009 | Radigan et al. | |
| 2001/0031900 A1 | 10/2001 | Margrave et al. | |
| 2005/0074966 A1 * | 4/2005 | Rhodes | 438/629 |
| 2006/0057290 A1 | 3/2006 | Glatkowski | |
| 2006/0250836 A1 | 11/2006 | Herner et al. | |
| 2006/0276099 A1 * | 12/2006 | Vink et al. | 445/35 |
| 2007/0190722 A1 | 8/2007 | Herner | |
| 2008/0070162 A1 * | 3/2008 | Ufert | 430/290 |
| 2009/0166609 A1 | 7/2009 | Schricker et al. | |
| 2009/0166610 A1 | 7/2009 | Schricker et al. | |
| 2009/0168491 A1 | 7/2009 | Schricker et al. | |
| 2009/0278112 A1 | 11/2009 | Schricker et al. | |

FOREIGN PATENT DOCUMENTS

| | | |
|---|---|---|
| EP | 1892722 | 2/2008 |
| WO | WO 03/037791 | 5/2003 |

OTHER PUBLICATIONS

International Search Report and Written Opinion of counterpart PCT/US2009/054219 mailed Nov. 3, 2009.

Kamimura, T., et al. "N-Type Doping for Single-Walled Carbon Nanotubes by Oxygen Ion Implantation with 25 EV Ultralow-Energy Ion Beam" Japanese Journal of Applied Physics, vol. 44, No. 11, pp. 8237-8239 (2005).

Yamamoto, K., et al. "Nitrogen Doping of Single-Walled Carbon Nanotube by Using Mass-Separated Low-Energy Ion Beams" Japanese Journal of Applied Physics, vol. 44, No. 4A, pp. 1611-1614 (2005).

(Continued)

*Primary Examiner* — Charles Garber
*Assistant Examiner* — Calvin Choi
(74) *Attorney, Agent, or Firm* — Dugan & Dugan, PC

(57) ABSTRACT

In some aspects, a method of forming a carbon nano-tube (CNT) memory cell is provided that includes (1) forming a first conductor; (2) forming a steering element above the first conductor; (3) forming a first conducting layer above the first conductor; (4) forming a CNT material above the first conducting layer; (5) implanting a selected implant species into the CNT material; (6) forming a second conducting layer above the CNT material; (7) etching the first conducting layer, CNT material and second conducting layer to form a metal-insulator-metal (MIM) stack; and (8) forming a second conductor above the CNT material and the steering element. Numerous other aspects are provided.

18 Claims, 12 Drawing Sheets

OTHER PUBLICATIONS

Xu, F., et al. "Nitrogen Doping of Single Walled Carbon Nanotubes by Low Energy N2<+> Ion Implantation" Carbon, vol. 46, No. 11, pp. 1489-1496 (2008).

Park, J.W., et al., "Effects of Artificial Defects on the Electrical Transport of Single-Walled Carbon Nanotubes", Applied Physics Letters, vol. 80, No. 1, pp. 133-135 (2002).

Cui, J.B. et al., "Carbon Nanotube Memory Devices of High Charge Storage Stabilit", Applied Physics Letters, vol. 81, No. 17, pp. 3260-3262 (2002).

Salonen, E. et al., :Ion-Irradiation-Induced Defects in Bundles of Carbon Nanotubes, Nuclear Instruments and Methods in Physics Research B 193, pp. 603-608 (2002).

* cited by examiner

METHODS FOR INCREASING CARBON NANO-TUBE (CNT) YIELD IN MEMORY DEVICES

CROSS-REFERENCE TO RELATED APPLICATIONS

This application claims the benefit of U.S. Provisional Patent Application Ser. No. 61/090,222, filed 19 Aug. 2008, and titled "Methods for Increasing Carbon Nano-Tube (CNT) Yield in Memory Devices," which is hereby incorporated by reference herein in its entirety for all purposes.

FIELD OF THE INVENTION

This invention relates to non-volatile memories, and more particularly to methods for increasing CNT yield in memory devices.

BACKGROUND

Non-volatile memories formed from reversible resistance switching elements are known. For example, U.S. patent application Ser. No. 11/968,154, filed Dec. 31, 2007, titled "Memory Cell That Employs A Selectively Fabricated Carbon Nano-Tube Reversible Resistance Switching Element And Methods Of Forming The Same" (the "'154 Application"), which is hereby incorporated by reference herein in its entirety for all purposes, describes a rewriteable non-volatile memory cell that includes a diode coupled in series with a carbon-based reversible resistivity switching material.

However, fabricating memory devices from carbon-based materials is technically challenging, and improved methods of forming memory devices that employ carbon-based materials are desirable.

SUMMARY

In a some aspects of the invention, a method of forming a reversible resistance-switching metal-insulator-metal stack is provided that includes (1) forming a first conducting layer; (2) forming a carbon nano-tube (CNT) material above the first conducting layer; (3) implanting a selected implant species into the CNT material; and (4) forming a second conducting layer above the CNT material.

In some aspects of the invention, a method of forming a carbon nano-tube (CNT) memory cell is provided that includes (1) forming a first conductor; (2) forming a steering element above the first conductor; (3) forming a first conducting layer above the first conductor; (4) forming a CNT material above the first conducting layer; (5) implanting a selected implant species into the CNT material; (6) forming a second conducting layer above the CNT material; (7) etching the first conducting layer, CNT material and second conducting layer to form a metal-insulator-metal (MIM) stack; and (8) forming a second conductor above the CNT material and the steering element.

Other features and aspects of the present invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which.

DETAILED DESCRIPTION

Figure 1:
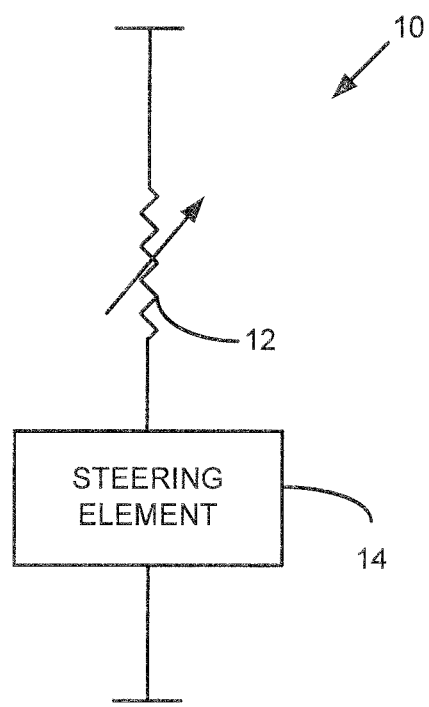
FIG. 1 is a diagram of an exemplary memory cell in accordance with this invention.

Some carbon nanotube ("CNT") materials may exhibit resistivity switching properties that may be used to form microelectronic non-volatile memories. Such films therefore are candidates for integration within a three-dimensional memory array.

Indeed, CNT materials have demonstrated memory switching properties on lab-scale devices with a 100× separation between ON and OFF states and mid-to-high range resistance changes. Such a separation between ON and OFF states renders CNT materials viable candidates for memory cells in which the CNT material is coupled in series with vertical diodes, thin film transistors or other steering elements. For example, a metal-insulator-metal ("MIM") stack formed from a CNT material sandwiched between two metal or otherwise conducting layers may serve as a resistance-switching element for a memory cell. In particular, a CNT MIM stack may be integrated in series with a diode or transistor to create a read-writable memory device as described, for example, in U.S. patent application Ser. No. 11/968,154, filed Dec. 31, 2007, and titled "MEMORY CELL THAT EMPLOYS A SELECTIVELY FABRICATED CARBON NANO-TUBE REVERSIBLE RESISTANCE-SWITCHING ELEMENT AND METHODS OF FORMING THE SAME", which is hereby incorporated by reference herein in its entirety.

Homogeneous CNT films are known to be porous, so a conventionally-formed CNT-based MIM structure may be prone to short-circuiting. In particular, to form a CNT memory cell using conventional semiconductor processes, physical vapor deposition ("PVD") processing steps are typically used to form the various conducting layers of the memory cell. The high energy levels of PVD-based metal deposition, however, may cause metal formed over a CNT film to infiltrate, and possibly penetrate, one or more CNT film pores. A short circuit thereby may be formed across the CNT MIM stack. Additionally, in both the case of a homogenous CNT film and a heterogeneous CNT film with filler material, the high energy levels used during PVD may damage the switching properties of the CNT film.

In accordance with embodiments of the invention, a CNT-based MIM structure may be formed that is less prone to short-circuiting. For example, in a first embodiment, a CNT-based MIM stack is formed by (1) forming a first conducting layer; (2) forming a CNT layer above the first conducting layer; (3) implanting a selected implant species into the CNT layer; and (4) forming a second conducting layer above the CNT layer. The first and/or second conducting layer may be a barrier and/or adhesion layer such as a metal nitride (e.g., titanium, tungsten or tantalum nitride), a metal such as tungsten (W) or molybdenum (Mo), or any other suitable conducting layer for forming an MIM stack. Exemplary species that may be implanted (e.g., using an ion implanter) into the CNT layer include N, $N_2$, O, $O_2$, Ar, Kr, Xe, C, Si, P, As, B, F, Cl, or other suitable species. In additional or alternative embodiments, an initial portion of the second conducting layer may be formed at a lower power than the remaining portion of the second conducting layer.

While not wishing to be bound by any particular theory, it is believed that the implanted species may partially "amorphize" the CNT layer, causing holes or voids in the carbon nanotubes to merge together, which may reduce or prevent punch-through during formation of the second conducting layer above the CNT layer. Significant improvement in device yield (e.g., significantly reduced short circuiting of the MIM stack) is observed even when a high power PVD step is used to form the second conducting layer. Use of a lower power deposition process, such as lower power PVD, during formation of an initial portion of the second conducting layer (e.g., the first 150 to 250 Angstroms of a 2000 Angstrom thick film) may also reduce short circuiting of the MIM stack due to metal penetration through the CNT layer.

In some embodiments of the invention, implanting species into a CNT layer has been observed to increase the initial resistivity of the CNT layer when compared to a CNT layer without an implant. Such an increased initial resistivity may improve switching performance by reducing the power (e.g., voltage and/or current) required for switching.

These and other embodiments of the invention are described further below with reference to FIGS. 1-4G.

Exemplary Inventive Memory Cell

FIG. 1 is a schematic illustration of an exemplary memory cell 10 in accordance with an embodiment of this invention. Memory cell 10 includes a reversible resistance switching element 12 coupled to a steering element 14. Reversible resistance switching element 12 includes a reversible resistivity switching material (not separately shown) having a resistivity that may be reversibly switched between two or more states.

For example, the reversible resistivity switching material of element 12 may be in an initial, low-resistivity state upon fabrication. Upon application of a first voltage and/or current, the material is switchable to a high-resistivity state. Application of a second voltage and/or current may return the reversible resistivity switching material to a low-resistivity state. Alternatively, reversible resistance switching element 12 may be in an initial, high-resistance state upon fabrication that is reversibly switchable to a low-resistance state upon application of the appropriate voltage(s) and/or current(s). When used in a memory cell, one resistance state may represent a binary "0," whereas another resistance state may represent a binary "1", although more than two data/resistance states may be used. Numerous reversible resistivity switching materials and operation of memory cells employing reversible resistance switching elements are described, for example, in U.S. patent application Ser. No. 11/125,939, filed May 9, 2005 and titled "Rewriteable Memory Cell Comprising A Diode And A Resistance Switching Material" (the "'939 application"), which is hereby incorporated by reference herein in its entirety for all purposes.

Steering element 14 may include a thin film transistor, a diode, a metal-insulator-metal tunneling current device, or another similar steering element that exhibits non-ohmic conduction by selectively limiting the voltage across and/or the current flow through reversible resistance switching element 12. In this manner, memory cell 10 may be used as part of a two or three dimensional memory array and data may be written to and/or read from memory cell 10 without affecting the state of other memory cells in the array.

Exemplary embodiments of memory cell 10, reversible resistance switching element 12 and steering element 14 are described below with reference to FIGS. 2A-2D and FIG. 3.

Exemplary Embodiments of Memory Cells and Memory Arrays

Figure 2A:
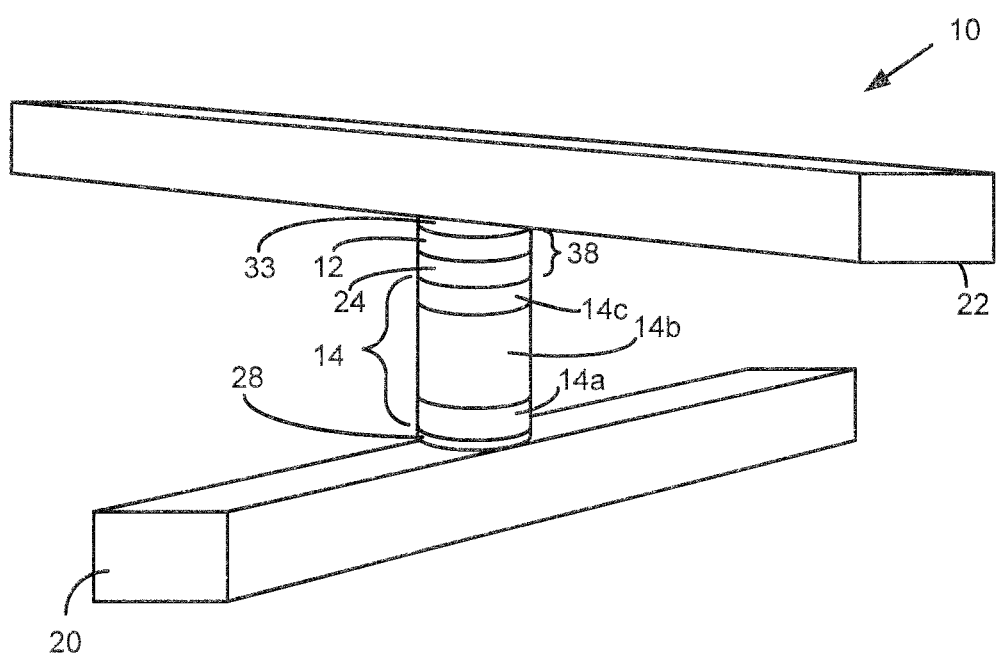
FIG. 2A is a simplified perspective view of an exemplary memory cell in accordance with this invention.

FIG. 2A is a simplified perspective view of an exemplary embodiment of a memory cell 10 in accordance with an embodiment of this invention that includes a steering element 14 and a carbon-based reversible resistance switching element 12. Reversible resistance switching element 12 is coupled in series with steering element 14 between a first conductor 20 and a second conductor 22. In some embodiments, a barrier layer 24 may be formed between reversible resistance switching element 12 and steering element 14. Barrier layer 33 may be formed between reversible resistance switching element 12 and second conductor 22. Barrier layer 24, reversible resistance switching element 12 and barrier layer 33 may form a metal-insulator-metal (MIM) stack 38 in series with the steering element 14. In some embodiments, the reversible resistance switching element 12 and/or MIM stack 38 may be positioned below the steering element 14. An additional barrier layer 28 also may be formed between steering element 14 and first conductor 20. Barrier layers 24, 28 and 33 may include titanium nitride, tantalum nitride, tungsten nitride, tungsten, molybdenum or another similar barrier layer.

As discussed above, steering element 14 may include a thin film transistor, a diode, a metal-insulator-metal tunneling current device, or another similar steering element that exhibits non-ohmic conduction by selectively limiting the voltage across and/or the current flow through reversible resistance switching element 12. In the example of FIG. 2A, steering element 14 is a diode. Accordingly, steering element 14 is sometimes referred to herein as "diode 14."

Diode 14 may include any suitable diode such as a vertical polycrystalline p-n or p-i-n diode, whether upward pointing with an n-region above a p-region of the diode or downward pointing with a p-region above an n-region of the diode. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed. Exemplary embodiments of diode 14 are described below with reference to FIG. 3.

Reversible resistance switching element 12 may include a carbon-based material (not separately shown) having a resistivity that may be reversibly switched between two or more states. For example, reversible resistance switching element 12 may include a CNT material or other similar carbon-based material. For simplicity, reversible resistance switching element 12 will be referred to in the remaining discussion as "CNT element 12."

First conductor 20 and/or second conductor 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20 and 22, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first conductor 20 and/or second conductor 22 to improve device performance and/or aid in device fabrication.

Figure 2B:
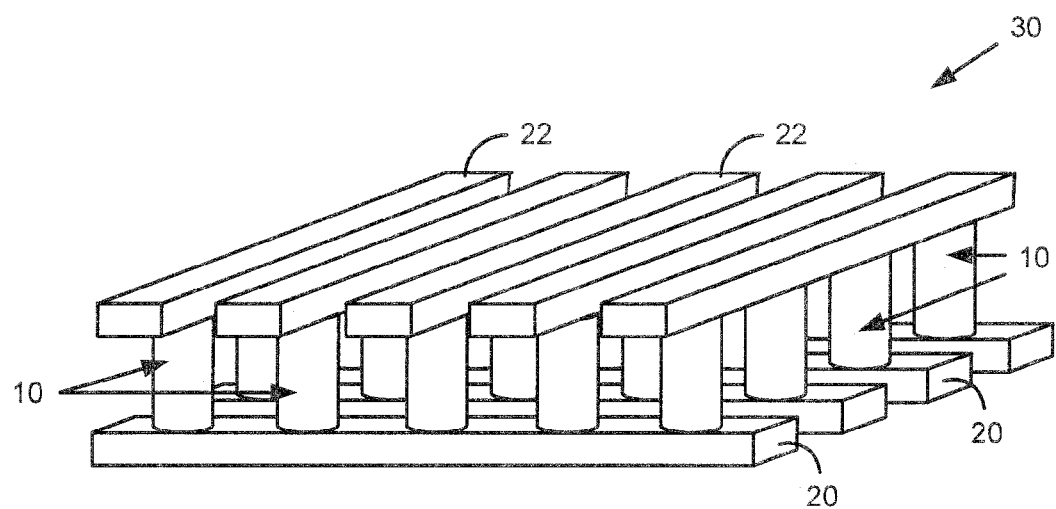
FIG. 2B is a simplified perspective view of a portion of a first exemplary memory level formed from a plurality of the memory cells of FIG. 2A.

FIG. 2B is a simplified perspective view of a portion of a first memory level 30 formed from a plurality of memory cells 10, such as memory cell 10 of FIG. 2A. For simplicity, CNT element 12, diode 14, and barrier layers 24, 28 and 33 are not separately shown. Memory level 30 is a "cross-point" array including a plurality of bit lines (second conductors 22) and word lines (first conductors 20) to which multiple memory cells are coupled (as shown). Other memory array configurations may be used, as may multiple levels of memory.

Figure 2C:
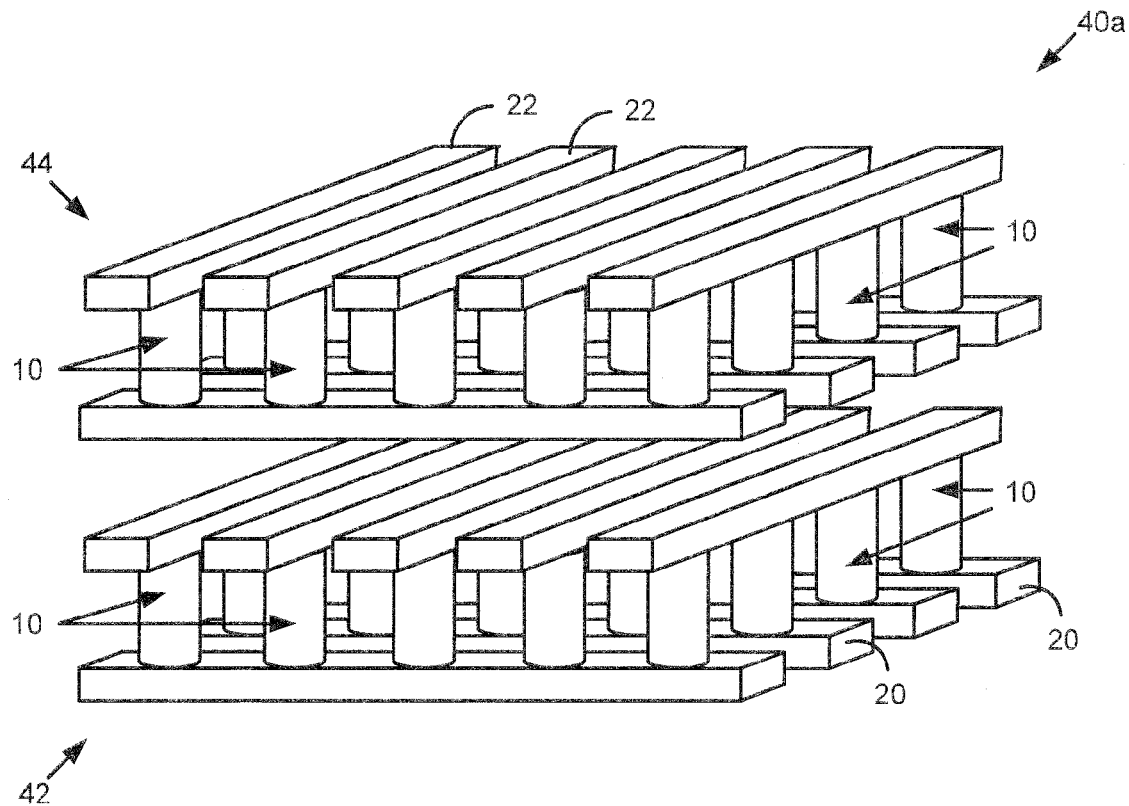
FIG. 2C is a simplified perspective view of a portion of a first exemplary three-dimensional memory array in accordance with this invention.

For example, FIG. 2C is a simplified perspective view of a portion of a monolithic three dimensional array 40a that includes a first memory level 42 positioned below a second memory level 44. Memory levels 42 and 44 each include a plurality of memory cells 10 in a cross-point array. Persons of ordinary skill in the art will understand that additional layers (e.g., an interlevel dielectric) may be present between the first and second memory levels 42 and 44, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
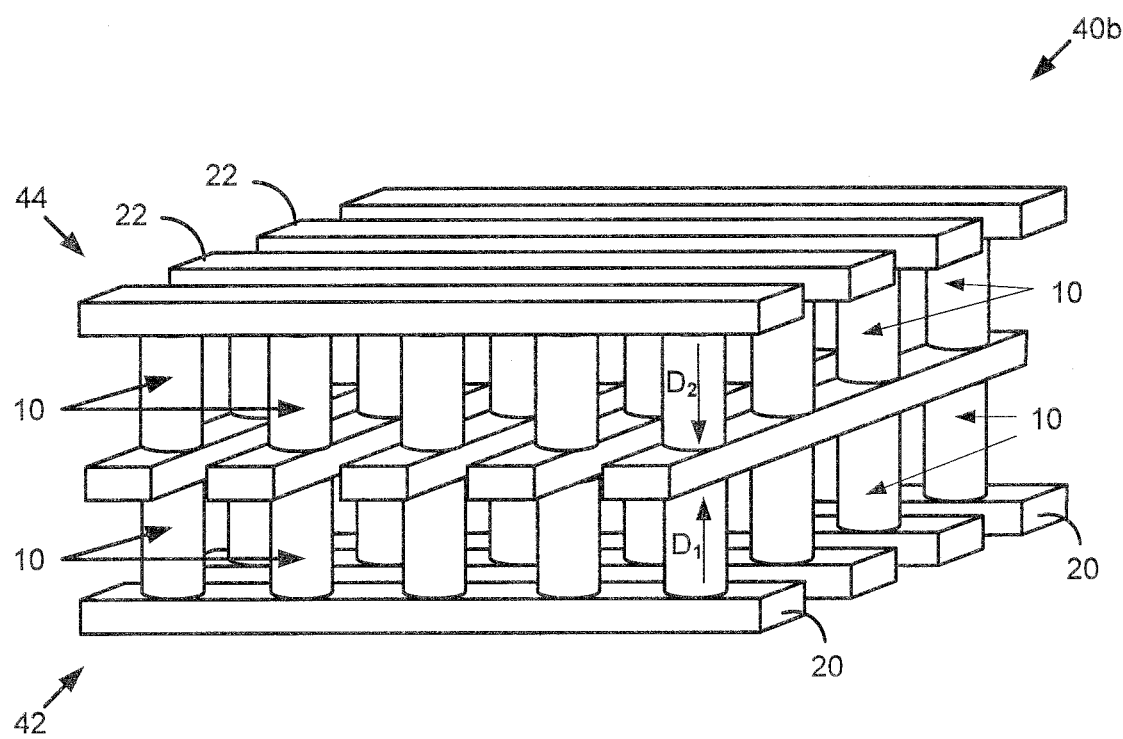
FIG. 2D is a simplified perspective view of a portion of a second exemplary three-dimensional memory array in accordance with this invention.

In some embodiments, the memory levels may be formed as described in U.S. Pat. No. 6,952,030, titled "High-Density Three-Dimensional Memory Cell" which is hereby incorporated by reference herein in its entirety for all purposes. For instance, the upper conductors of a first memory level may be used as the lower conductors of a second memory level that is positioned above the first memory level as shown in the alternative exemplary three dimensional memory array 40b illustrated in FIG. 2D. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (hereinafter "the '151 application"), which is hereby incorporated by reference herein in its entirety for all purposes. For example, as shown in FIG. 2D, the diodes of the first memory level 42 may be upward pointing diodes as indicated by arrow D1 (e.g., with p regions at the bottom of the diodes), whereas the diodes of the second memory level 44 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

In some embodiments, a resistivity of the CNT material used to form CNT element 12 is at least $1\times10$ ohm-cm when CNT element 12 is in an ON-state, whereas a resistivity of the CNT material used to form CNT element 12 is at least $1\times10^3$ ohm-cm when CNT element 12 is in an OFF-state. Other resistivities may be used.

Figure 3:
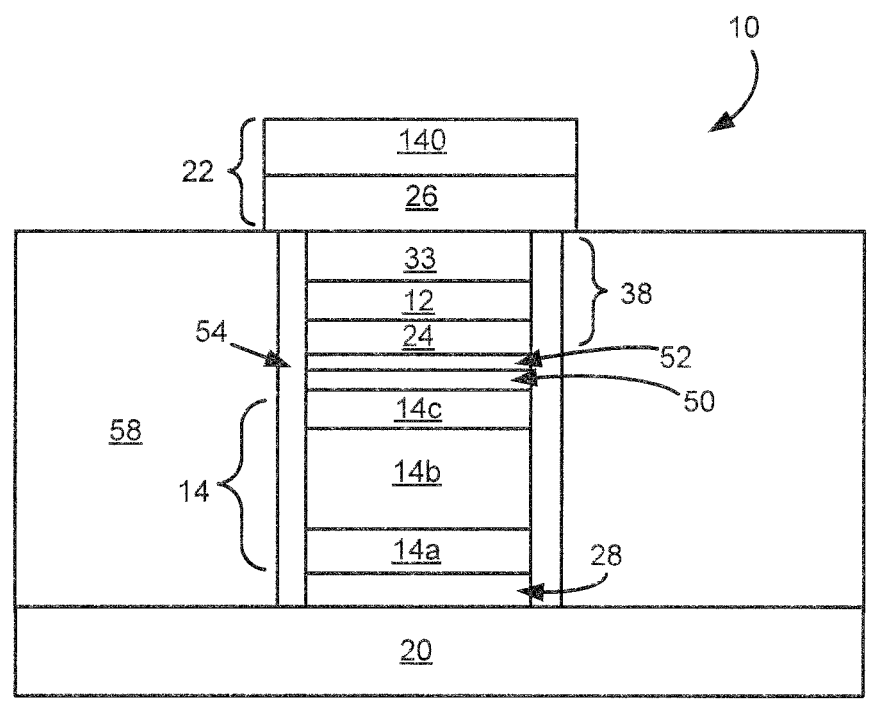
FIG. 3 is a cross-sectional view of an exemplary embodiment of a memory cell in accordance with this invention.

FIG. 3 is a cross-sectional view of an exemplary embodiment of memory cell 10 of FIG. 1. In particular, FIG. 3 shows an exemplary memory cell 10 which includes CNT element 12, diode 14, and first and second conductors 20 and 22, respectively. Memory cell 10 may also include barrier layers 24, 28, and 33, a silicide layer 50, a silicide-forming metal layer 52, and dielectric layer 58, as well as adhesion layers, antireflection coating layers and/or the like (not shown) which may be used with first and/or second conductors 20 and 22, respectively, to improve device performance and/or facilitate device fabrication. In some embodiments, a sidewall liner 54 may be used to separate selected layers of memory cell 10 from dielectric layer 58.

In FIG. 3, diode 14 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, diode 14 may be formed from a polycrystalline semiconductor material such as polysilicon, a polycrystalline silicon-germanium alloy, polygermanium or any other suitable material. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed.

In some embodiments, a thin germanium and/or silicon-germanium alloy layer (not shown) may be formed on n+ polysilicon region 14a to prevent and/or reduce dopant migration from n+ polysilicon region 14a into intrinsic region 14b. Use of such a layer is described, for example, in U.S. patent application Ser. No. 11/298,331, filed Dec. 9, 2005 and titled "Deposited Semiconductor Structure To Minimize N-Type Dopant Diffusion And Method Of Making" (hereinafter "the '331 application"), which is hereby incorporated by reference herein in its entirety for all purposes. In some embodiments, a few hundred angstroms or less of silicon-germanium alloy with about 10 at % or more of germanium may be employed.

Barrier layer 28, such as titanium nitride, tantalum nitride, tungsten nitride, tungsten, molybdenum, etc., may be formed between the first conductor 20 and the n+ region 14a (e.g., to prevent and/or reduce migration of metal atoms into the polysilicon regions).

If diode 14 is fabricated from deposited silicon (e.g., amorphous or polycrystalline), a silicide layer 50 may be formed on diode 14 to place the deposited silicon in a low resistivity state, as fabricated. Such a low resistivity state allows for easier programming of memory cell 10 as a large voltage is not required to switch the deposited silicon to a low resistivity state. For example, a silicide-forming metal layer 52 such as titanium or cobalt may be deposited on p+ polysilicon region 14c. During a subsequent anneal step (described below), silicide-forming metal layer 52 and the deposited silicon of diode 14 interact to form silicide layer 50, consuming all or a portion of the silicide-forming metal layer 52. In some embodiments, a nitride layer (not shown) may be formed at a top surface of silicide-forming metal layer 52. For example, if silicide-forming metal layer 52 is titanium, a TiN layer may be formed at a top surface of silicide-forming metal layer 52.

A rapid thermal anneal ("RTA") step may then be performed to form silicide regions by reaction of silicide-forming metal layer 52 with p+ region 14c. The RTA may be performed at about 540° C. for about 1 minute, and causes silicide-forming metal layer 52 and the deposited silicon of diode 14 to interact to form silicide layer 50, consuming all or a portion of the silicide-forming metal layer 52. An additional, higher temperature anneal (e.g., such as at about 750° C. as described below) may be used to crystallize the diode. As described in U.S. Pat. No. 7,176,064, titled "Memory Cell Comprising A Semiconductor Junction Diode Crystallized Adjacent To A Silicide," which is hereby incorporated by reference herein in its entirety for all purposes, silicide-forming materials such as titanium and/or cobalt react with deposited silicon during annealing to form a silicide layer. The lattice spacings of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the diode 14 during annealing). Lower resistivity silicon thereby is provided. Similar results may be achieved for silicon-germanium alloy and/or germanium diodes.

In embodiments in which a nitride layer was formed at a top surface of silicide-forming metal layer 52, following the RTA step, the nitride layer may be stripped using a wet chemistry. For example, if silicide-forming metal layer 52 includes a TiN top layer, a wet chemistry (e.g., ammonium, peroxide, water in a 1:1:1 ratio) may be used to strip any residual TiN. In some embodiments, the nitride layer formed at a top surface of silicide-forming metal layer 52 may remain, or may not be used at all.

Barrier layer 24, such as titanium nitride, tantalum nitride, tungsten nitride, tungsten, molybdenum, etc., is formed above metal-forming silicide layer 52. In some embodiments, the barrier layer 24 may be TiN with a thickness of about 100 to 2000 angstroms, although other materials and/or thicknesses may be used.

CNT element 12 is formed above barrier layer 24 by depositing or otherwise forming a layer of CNT material. CNT material may be formed over the barrier layer 24 using any suitable CNT formation process. One technique involves spray- or spin-coating a carbon nanotube suspension over the barrier layer 24, thereby creating a random CNT material. Another technique involves growing carbon nanotubes from a seed anchored to the substrate by chemical vapor deposition (CVD), plasma-enhanced CVD (PECVD) or the like. Discussions of various CNT deposition techniques are found in related applications, hereby incorporated by reference herein in their entireties, U.S. patent application Ser. No. 11/968,154, "MEMORY CELL THAT EMPLOYS A SELECTIVELY FABRICATED CARBON NANO-TUBE REVERSIBLE RESISTANCE-SWITCHING ELEMENT AND METHODS OF FORMING THE SAME"; U.S. patent application Ser. No. 11/968,156, "MEMORY CELL THAT EMPLOYS A SELECTIVELY FABRICATED CARBON NANO-TUBE REVERSIBLE RESISTANCE-SWITCHING ELEMENT FORMED OVER A BOTTOM CONDUCTOR AND METHODS OF FORMING THE SAME"; and U.S. patent application Ser. No. 11/968,159, "MEMORY CELL WITH PLANARIZED CARBON NANOTUBE LAYER AND METHODS OF FORMING THE SAME".

Any suitable thickness may be employed for the CNT material of CNT element 12. In one embodiment, a CNT material thickness of about 100 to about 1000, and more preferably about 400-600 angstroms, may be used.

Barrier layer 33, such as titanium nitride, tantalum nitride, tungsten nitride, tungsten, molybdenum, etc., is formed above CNT element 12. In some embodiments, the barrier layer 33 may be TiN with a thickness of about 100 to 2000 angstroms, although other materials and/or thicknesses may be used.

Memory cell 10 also includes a sidewall liner 54 formed along the sides of the memory cell layers. Liner 54 may be formed using a dielectric material, such as silicon nitride, silicon oxynitride, low K dielectrics, etc. Exemplary low K dielectrics include carbon doped oxides, silicon carbon layers, or the like.

In some embodiments of the invention, the CNT material of CNT element 12 may be implanted with an appropriate implant species to increase device yield (e.g., the number of devices that switch for up to about 200 cycles). For example, the present inventors have found that implanting nitrogen (e.g., atomic or molecular nitrogen) significantly increases device yield. In at least some embodiments, implanting nitrogen into the CNT material of CNT element 12 has been found to dramatically increase device yield so that all memory devices tested on a substrate were found to switch up to at least 200 cycles (e.g., 100% yield). Exemplary species that may be implanted to affect CNT material yield include N, $N_2$, O, $O_2$, Ar, Kr, Xe, C, Si, P, As, B, F, Cl, combinations thereof and the like. Exemplary acceleration voltages range from about 1-20 KeV, and more preferably about 2-7 KeV. Exemplary doses range from about $1 \times 10^{13}$-$1 \times 10^{20}$ atoms/cm$^2$, and more preferably about $1$-$5 \times 10^{15}$ atoms/cm$^2$. Implant angles may range from about 3.5-10 degrees, and more preferably about 5-9 degrees. Other implant species, acceleration voltages, doses and/or implant angles may be used.

As stated, following formation/implantation of the CNT element 12, barrier layer 33, is formed over the CNT element 12. In at least one embodiment, barrier layer 33 may be deposited without a pre-clean or pre-sputter step prior to deposition. Exemplary TiN deposition process conditions are as follows:

| PROCESS PARAMETER | EXEMPLARY TOP ADHESION/BARRIER LAYER DEPOSITION PARAMETERS | |
| --- | --- | --- |
| | EXEMPLARY RANGE | PREFERRED RANGE |
| Argon Flow Rate (sccm) | 20-40 | 20-30 |
| Ar With Dilute $H_2$ (<10%) Flow Rate (sccm) | 0-30 | 0-10 |
| Nitrogen Flow Rate (sccm) | 50-90 | 60-70 |
| Pressure (milliTorr) | 1-5000 | 1800-2400 |
| Power (Watts) | 10-9000 | 2000-9000 |
| Power Ramp Rate (Watts/sec) | 10-5000 | 2000-4000 |
| Process Temperature (° C.) | 100-600 | 200-350 |
| Deposition Time (sec) | 5-200 | 10-150 |

Other flow rates, pressures, powers, power ramp rates, process temperatures and/or deposition times may be used. Exemplary deposition chambers include the Endura 2 tool available from Applied Materials, Inc. of Santa Clara, Calif. Other processing tools may be used. In some embodiments, a buffer chamber pressure of about $1$-$2 \times 10^{-7}$ Torr and a transfer chamber pressure of about $2$-$5 \times 10^{-8}$ Torr may be used. The deposition chamber may be stabilized for about 250-350 seconds with about 60-80 sccm Ar, 60-70 sccm $N_2$, and about 5-10 sccm of Ar with dilute $H_2$ at about 1800-2400 milliTorr.

In some embodiments, it may take about 2-5 seconds to strike the target. Other buffer chamber pressures, transfer chamber pressures and/or deposition chamber stabilization parameters may be used. Note that such a high power TiN barrier layer deposition process does not cause shorting or punch through, and CNT switching behavior following device formation is observed.

In some embodiments, the use of a nitrogen implant in the CNT material of CNT element 12 and/or a high power TiN deposition (as described above), was observed to produce a faster set speed, a higher yield and a higher reset voltage for devices formed with the CNT material.

In one embodiment, after the CNT material of CNT element 12 is implanted with a selected implant species, barrier layer 33 is formed using a high power deposition. For example, between about 100 and about 2000 angstroms of TiN may be deposited using about 8000 to about 9000 Watts of power. In another embodiment, a first portion of barrier layer 33 is formed using a lower power deposition, and a second portion of barrier layer 33 is formed using a higher power deposition. For example, between about 150 to about 250 angstroms of TiN may be initially deposited using about 2000 to about 3000 Watts of power, and between about 1750 to about 1850 angstroms of TiN may be deposited using about 8000 to about 9000 Watts of power. Such an embodiment may be used with or without the CNT implant. Other powers and/or thickness ranges may be used.

In some embodiments, the CNT element 12 may be positioned below the diode 14.

Exemplary Fabrication Processes for Memory Cells

Referring now to FIGS. 4A-4G, a first exemplary method of forming a memory level in accordance with this invention is described. In particular, FIGS. 4A-4G illustrate an exemplary method of forming a memory level including memory cells 10 of FIG. 3. As will be described below, the first memory level includes a plurality of memory cells that each include a steering element and a carbon-based (e.g., CNT) reversible resistance switching element coupled to the steering element. Additional memory levels may be fabricated above the first memory level (as described previously with reference to FIGS. 2C-2D).

Figure 4A:
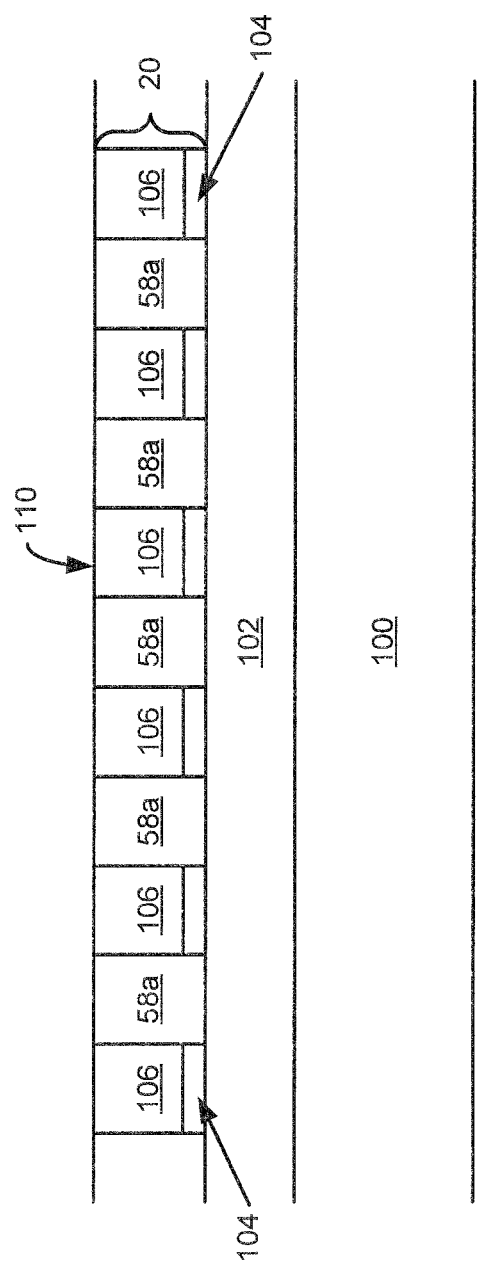
FIGS. 4A-4G illustrate cross-sectional views of a portion of a substrate during an exemplary fabrication of a single memory level in accordance with this invention.

With reference to FIG. 4A, substrate 100 is shown as having already undergone several processing steps. Substrate 100 may be any suitable substrate such as a silicon, germanium, silicon-germanium, undoped, doped, bulk, silicon-on-insulator ("SOI") or other substrate with or without additional circuitry. For example, substrate 100 may include one or more n-well or p-well regions (not shown).

Isolation layer 102 is formed above substrate 100. In some embodiments, isolation layer 102 may be a layer of silicon dioxide, silicon nitride, silicon oxynitride or any other suitable insulating layer.

Following formation of isolation layer 102, an adhesion layer 104 is formed over isolation layer 102 (e.g., by physical vapor deposition or another method). For example, adhesion layer 104 may be about 20 to about 500 angstroms, and preferably about 100 angstroms, of titanium nitride or another suitable adhesion layer such as tantalum nitride, tungsten nitride, tungsten, molybdenum, combinations of one or more adhesion layers, or the like. Other adhesion layer materials and/or thicknesses may be employed. In some embodiments, adhesion layer 104 may be optional.

After formation of adhesion layer 104, a conductive layer 106 is deposited over adhesion layer 104. Conductive layer 106 may include any suitable conductive material such as tungsten or another appropriate metal, heavily doped semiconductor material, a conductive silicide, a conductive silicide-germanide, a conductive germanide, or the like deposited by any suitable method (e.g., chemical vapor deposition ("CVD"), physical vapor deposition ("PVD"), etc.). In at least one embodiment, conductive layer 106 may comprise about 200 to about 2500 angstroms of tungsten. Other conductive layer materials and/or thicknesses may be used.

Following formation of conductive layer 106, adhesion layer 104 and conductive layer 106 are patterned and etched. For example, adhesion layer 104 and conductive layer 106 may be patterned and etched using conventional lithography techniques, with a soft or hard mask, and wet or dry etch processing. In at least one embodiment, adhesion layer 104 and conductive layer 106 are patterned and etched to form substantially parallel, substantially co-planar first conductors 20. Exemplary widths for first conductors 20 and/or spacings between first conductors 20 range from about 200 to about 2500 angstroms, although other conductor widths and/or spacings may be used.

After first conductors 20 have been formed, a dielectric layer 58a is formed over substrate 100 to fill the voids between first conductors 20. For example, approximately 3000-7000 angstroms of silicon dioxide may be deposited on the substrate 100 and planarized using chemical mechanical polishing or an etchback process to form a planar surface 110. Planar surface 110 includes exposed top surfaces of first conductors 20 separated by dielectric material (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

In other embodiments of the invention, first conductors 20 may be formed using a damascene process in which dielectric layer 58a is formed, patterned and etched to create openings or voids for first conductors 20. The openings or voids then may be filled with adhesion layer 104 and conductive layer 106 (and/or a conductive seed, conductive fill and/or barrier layer if needed). Adhesion layer 104 and conductive layer 106 then may be planarized to form planar surface 110. In such an embodiment, adhesion layer 104 will line the bottom and sidewalls of each opening or void.

Figure 4B:
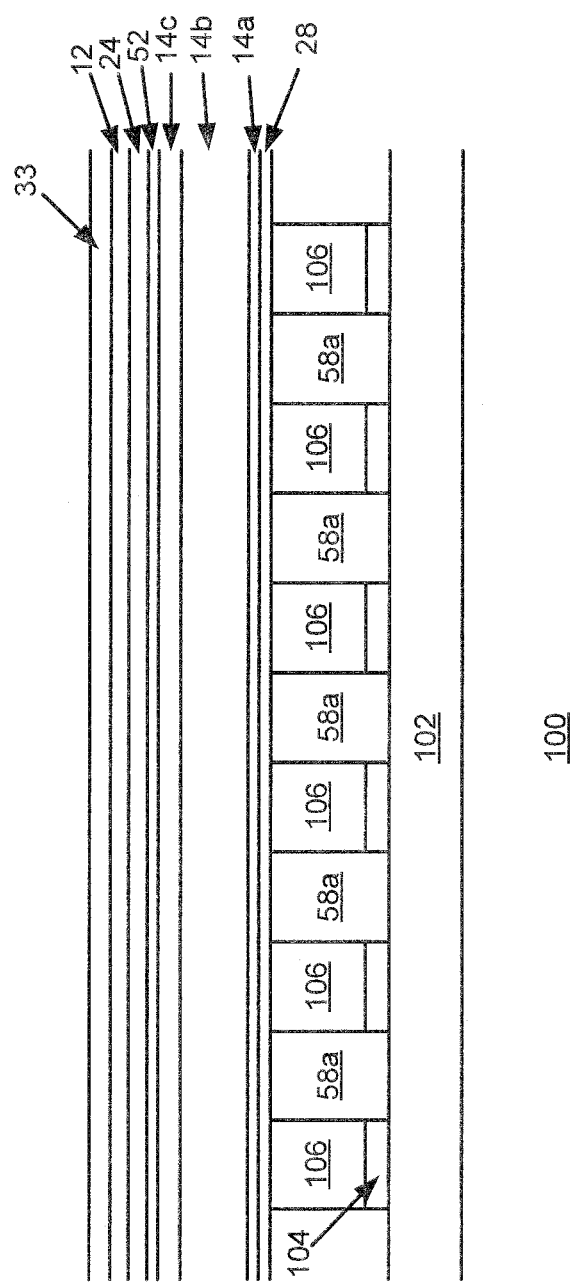

Following planarization, the diode structures of each memory cell are formed. With reference to FIG. 4B, a barrier layer 28 is formed over planarized top surface 110 of substrate 100. In some embodiments, barrier layer 28 may be about 20 to about 500 angstroms, and preferably about 100 angstroms, of titanium nitride or another suitable barrier layer such as tantalum nitride, tungsten nitride, tungsten, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 28, deposition of the semiconductor material used to form the diode of each memory cell begins (e.g., diode 14 in FIGS. 1 and 3). Each diode may be a vertical p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference to FIG. 4B, following formation of barrier layer 28, a heavily doped n+ silicon layer 14a is deposited on barrier layer 28. In some embodiments, n+ silicon layer 14a is in an amorphous state as deposited. In other embodiments, n+ silicon layer 14*a* is in a polycrystalline state as deposited. CVD or another suitable process may be employed to deposit n+ silicon layer 14*a*. In at least one embodiment, n+ silicon layer 14*a* may be formed, for example, from about 100 to about 1000 angstroms, preferably about 100 angstroms, of phosphorus or arsenic doped silicon having a doping concentration of about $10^{21}$ cm$^{-3}$. Other layer thicknesses, doping types and/or doping concentrations may be used. N+ silicon layer 14*a* may be doped in situ, for example, by flowing a donor gas during deposition. Other doping methods may be used (e.g., implantation).

After deposition of n+ silicon layer 14*a*, a lightly doped, intrinsic and/or unintentionally doped silicon layer 14*b* may be formed over n+ silicon layer 14*a*. In some embodiments, intrinsic silicon layer 14*b* may be in an amorphous state as deposited. In other embodiments, intrinsic silicon layer 14*b* may be in a polycrystalline state as deposited. CVD or another suitable deposition method may be employed to deposit intrinsic silicon layer 14*b*. In at least one embodiment, intrinsic silicon layer 14*b* may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 14*a* prior to depositing intrinsic silicon layer 14*b* to prevent and/or reduce dopant migration from n+ silicon layer 14*a* into intrinsic silicon layer 14*b* (as described in the '331 application, previously incorporated).

P-type silicon may be either deposited and doped by ion implantation or may be doped in situ during deposition to form a p+ silicon layer 14*c*. For example, a blanket p+ implant may be employed to implant boron a predetermined depth within intrinsic silicon layer 14*b*. Exemplary implantable molecular ions include $BF_2$, $BF_3$, B and the like. In some embodiments, an implant dose of about $1-5\times10^{15}$ ions/cm$^2$ may be employed. Other implant species and/or doses may be used. Further, in some embodiments, a diffusion process may be employed. In at least one embodiment, the resultant p+ silicon layer 14*c* has a thickness of about 100-700 angstroms, although other p+ silicon layer sizes may be used.

Following formation of p+ silicon layer 14*c*, a silicide-forming metal layer 52 is deposited over p+ silicon layer 14*c*. Exemplary silicide-forming metals include sputter or otherwise deposited titanium or cobalt. In some embodiments, silicide-forming metal layer 52 has a thickness of about 10 to about 200 angstroms, preferably about 20 to about 50 angstroms and more preferably about 20 angstroms. Other silicide-forming metal layer materials and/or thicknesses may be used. A nitride layer (not shown) may be formed at the top of silicide-forming metal layer 52.

Following formation of silicide-forming metal layer 52, an RTA step may be performed at about 540° C. for about one minute to form silicide layer 50 (FIG. 3), consuming all or a portion of the silicide-forming metal layer 52. Following the RTA step, any residual nitride layer from silicide-forming metal layer 52 may be stripped using a wet chemistry, as described above. Other annealing conditions may be used.

Following the RTA step and the nitride strip step, barrier layer 24 is formed. In some embodiments, barrier layer 24 may be about 20 to about 500 angstroms, and preferably about 100 angstroms, of titanium nitride or another suitable barrier layer such as tantalum nitride, tungsten nitride, tungsten, molybdenum, titanium-silicide, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed. For example, in some embodiments, the barrier layer 24 may be TiN with a thickness of about 100 to 2000 angstroms.

CNT element 12 is formed above barrier layer 24. CNT material may be deposited by various techniques. One technique involves spray- or spin-coating a carbon nanotube suspension, thereby creating a random CNT material. Another technique involves growing carbon nanotubes from a seed anchored to the substrate by chemical vapor deposition (CVD), plasma-enhanced CVD (PECVD) or the like. Discussions of various CNT deposition techniques are found in previously incorporated U.S. patent application Ser. No. 11/968,154, "MEMORY CELL THAT EMPLOYS A SELECTIVELY FABRICATED CARBON NANO-TUBE REVERSIBLE RESISTANCE-SWITCHING ELEMENT AND METHODS OF FORMING THE SAME"; U.S. patent application Ser. No. 11/968,156, "MEMORY CELL THAT EMPLOYS A SELECTIVELY FABRICATED CARBON NANO-TUBE REVERSIBLE RESISTANCE-SWITCHING ELEMENT FORMED OVER A BOTTOM CONDUCTOR AND METHODS OF FORMING THE SAME"; and U.S. patent application Ser. No. 11/968,159, "MEMORY CELL WITH PLANARIZED CARBON NANOTUBE LAYER AND METHODS OF FORMING THE SAME".

Any suitable thickness may be employed for the CNT material of CNT element 12. In one embodiment, a CNT material thickness of about 100 to about 1000, and more preferably about 400-600 angstroms, may be used.

In some embodiments of the invention, the CNT material of CNT element 12 may be implanted with an appropriate implant species to increase device yield (e.g., the number of devices that switch for up to about 200 cycles). For example, the present inventors have found that implanting nitrogen (e.g., atomic or molecular nitrogen) significantly increases device yield. In at least some embodiments, implanting nitrogen into the CNT material of CNT element 12 has been found to dramatically increase device yield so that all memory devices tested on a substrate were found to switch up to at least 200 cycles (e.g., 100% yield). Exemplary species that may be implanted to affect CNT material yield include N, $N_2$, O, $O_2$, Ar, Kr, Xe, C, Si, P, As, B, F, Cl, combinations thereof, and the like. Exemplary acceleration voltages range from about 1-20 KeV, and more preferably about 2-7 KeV. Exemplary doses range from about $1\times10^{13}$-$1\times10^{20}$ atoms/cm$^2$, and more preferably about $1-5\times10^{15}$ atoms/cm$^2$. Implant angles may range from about 3.5-10 degrees, and more preferably about 5-9 degrees. Other implant species, acceleration voltages, doses and/or implant angles may be used.

Above CNT element 12, barrier layer 33 is formed. Barrier layer 33 may be about 20 to about 500 angstroms, and preferably about 100 angstroms, of titanium nitride or another suitable barrier layer such as tantalum nitride, tungsten nitride, tungsten, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed. For example, in some embodiments, the barrier layer 33 may be TiN with a thickness of about 100 to 2000 angstroms.

In at least one embodiment, barrier layer 33 may be deposited without a pre-clean or pre-sputter step prior to deposition. Exemplary deposition process conditions are as set forth in Table 1.

TABLE 1

EXEMPLARY ADHESION/BARRIER
LAYER DEPOSITION PARAMETERS

| PROCESS PARAMETER | EXEMPLARY RANGE | PREFERRED RANGE |
|---|---|---|
| Argon Flow Rate (sccm) | 20-40 | 20-30 |
| Ar With Dilute $H_2$ (<10%) Flow Rate (sccm) | 0-30 | 0-10 |
| Nitrogen Flow Rate (sccm) | 50-90 | 60-70 |
| Pressure (milliTorr) | 1-5000 | 1800-2400 |
| Power (Watts) | 10-9000 | 2000-9000 |
| Power Ramp Rate (Watts/sec) | 10-5000 | 2000-4000 |
| Process Temperature (° C.) | 100-600 | 200-350 |
| Deposition Time (sec) | 5-200 | 10-150 |

Other flow rates, pressures, powers, power ramp rates, process temperatures and/or deposition times may be used. Exemplary deposition chambers include the Endura 2 tool available from Applied Materials, Inc. of Santa Clara, Calif. Other processing tools may be used. In some embodiments, a buffer chamber pressure of about $1-2\times10^{-7}$ Torr and a transfer chamber pressure of about $2-5\times10^{-8}$ Torr may be used. The deposition chamber may be stabilized for about 250-350 seconds with about 60-80 sccm Ar, 60-70 sccm $N_2$, and about 5-10 sccm of Ar with dilute $H_2$ at about 1800-2400 milliTorr. In some embodiments, it may take about 2-5 seconds to strike the target. Other buffer chamber pressures, transfer chamber pressures and/or deposition chamber stabilization parameters may be used. Note that such a high power TiN barrier layer deposition process does not cause shorting or punch through, and CNT switching behavior following device formation is observed.

In one embodiment, after the CNT material of CNT element 12 is implanted with a selected implant species, barrier layer 33 is formed using a high power deposition. For example, between about 100 and about 2000 angstroms of TiN may be deposited using about 8000 to about 9000 Watts of power. In another embodiment, a first portion of barrier layer 33 is formed using a lower power deposition, and a second portion of barrier layer 33 is formed using a higher power deposition. For example, between about 150 to about 250 angstroms of TiN may be initially deposited using about 2000 to about 3000 Watts of power, and between about 1750 to about 1850 angstroms of TiN may be deposited using about 8000 to about 9000 Watts of power. Such an embodiment may be used with or without the CNT implant. Other powers and/or thickness ranges may be used.

Figure 4C:
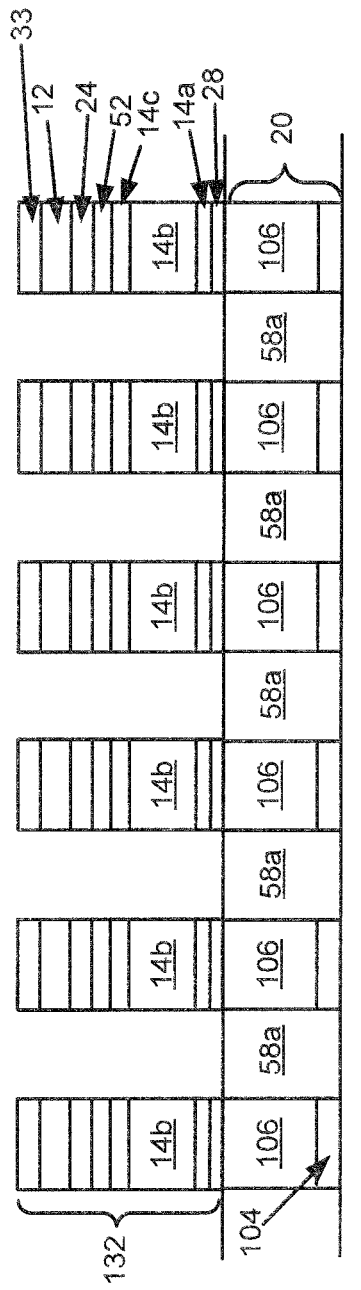

As shown in FIG. 4C, barrier layer 33, CNT element 12, barrier layer 24, silicide-forming metal layer 52, diode layers 14a-14c, and barrier layer 28 are patterned and etched to form pillars 132. Pillars 132 may be formed above corresponding conductors 20 and have substantially the same width as conductors 20, for example, although other widths may be used. Some misalignment may be tolerated. The memory cell layers may be patterned and etched in a single pattern/etch procedure or using separate pattern/etch steps. In at least one embodiment, barrier layer 33, CNT element 12 and barrier layer 24 are etched together to form MIM stack 38 (FIG. 3).

For example, photoresist may be deposited, patterned using standard photolithography techniques, layers 28, 14a-14c, 52, 24, 12, and 33 may be etched, and then the photoresist may be removed. Alternatively, a hard mask of some other material, for example silicon dioxide, may be formed on top of the barrier layer 33, with bottom antireflective coating ("BARC") on top, then patterned and etched. Similarly, dielectric antireflective coating ("DARC") may be used as a hard mask. In some embodiments, one or more additional metal layers may be formed above the CNT element 12 and diode 14 and used as a metal hard mask that remains part of the pillars 132. Use of metal hard masks is described, for example, in U.S. patent application Ser. No. 11/444,936, filed May 13, 2006 and titled "CONDUCTIVE HARD MASK TO PROTECT PATTERNED FEATURES DURING TRENCH ETCH" (hereinafter "the '936 application") which is hereby incorporated by reference herein in its entirety.

Pillars 132 may be formed using any suitable masking and etching process. For example, layers 28, 14a-14c, 52, 24, 12, and 33 may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

In at least some embodiments, a technique for etching CNT material using $BCl_3$ and $Cl_2$ chemistries may be employed. For example, U.S. patent application Ser. No. 12/421,803, filed Apr. 10, 2009, titled "METHODS FOR ETCHING CARBON NANO-TUBE FILMS FOR USE IN NON-VOLATILE MEMORIES" (Attorney Docket No. SD-MXA-259), which is hereby incorporated by reference herein in its entirety for all purposes, describes techniques for etching CNT material using $BCl_3$ and $Cl_2$ chemistries. In other embodiments, a directional, oxygen-based etch may be employed such as is described in U.S. Provisional Patent Application Ser. No. 61/225,487, filed Jul. 14, 2009, which is hereby incorporated by reference herein in its entirety for all purposes. Any other suitable etch chemistries and/or techniques may be used.

In some embodiments, after etching, pillars 132 may be cleaned using a dilute hydrofluoric/sulfuric acid clean. Such cleaning, whether or not PR ashing is performed before etching, may be performed in any suitable cleaning tool, such as a Raider tool, available from Semitool of Kalispell, Mont. Exemplary post-etch cleaning may include using ultra-dilute sulfuric acid (e.g., about 1.5-1.8 wt %) for about 60 seconds and ultra-dilute hydrofluoric ("HF") acid (e.g., about 0.4-0.6 wt %) for 60 seconds. Megasonics may or may not be used. Other clean chemistries, times and/or techniques may be employed.

Figure 4D:
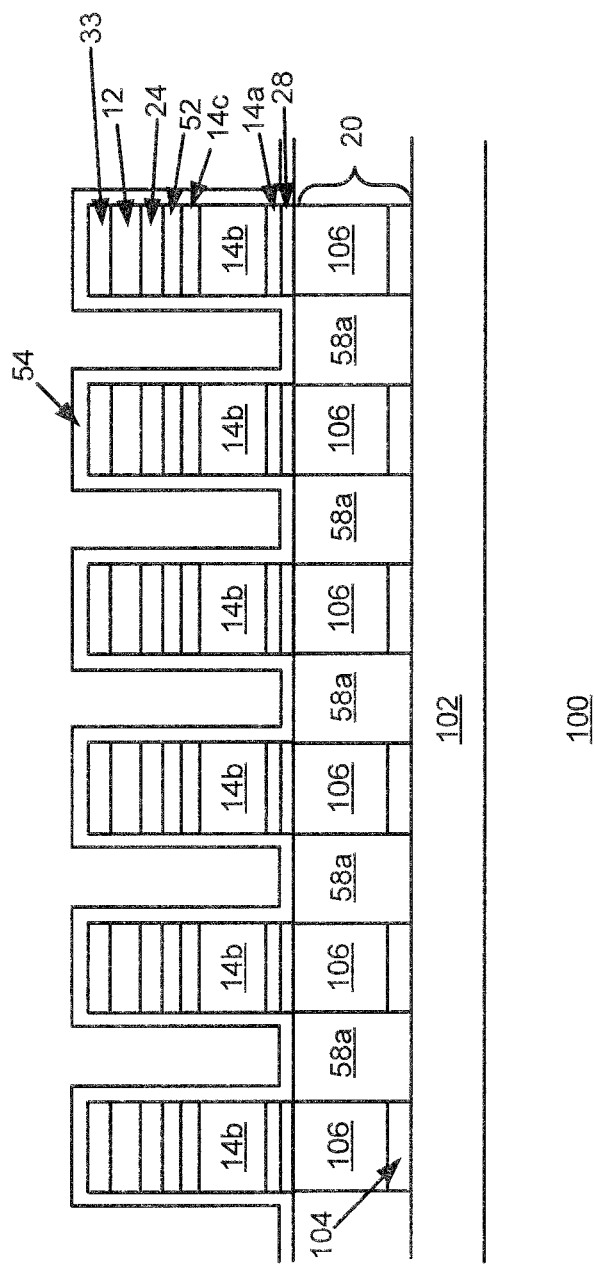

A dielectric liner 54 is deposited conformally over pillars 132, as illustrated in FIG. 4D. In at least one embodiment, dielectric liner 54 may be formed with an oxygen-poor deposition chemistry (e.g., without a high oxygen plasma component) to protect the CNT material of reversible resistance switching element 12 during a subsequent deposition of an oxygen-rich gap-fill dielectric 58b (e.g., $SiO_2$) (not shown in FIG. 4D). For instance, dielectric sidewall liner 54 may comprise about 200 to about 500 angstroms of silicon nitride. However, the structure optionally may comprise other layer thicknesses and/or other materials, such as $Si_xC_yN_z$ and $Si_xO_yN_z$ (with low O content), etc., where x, y and z are non-zero numbers resulting in stable compounds. Persons of ordinary skill in the art will understand that other dielectric materials may be used to form dielectric liner 54.

In one exemplary embodiment, a SiN dielectric liner 54 may be formed using the process parameters listed in Table 2. Liner film thickness scales linearly with time. Other powers, temperatures, pressures, thicknesses and/or flow rates may be used.

TABLE 2

PECVD SiN LINER PROCESS PARAMETERS

| PROCESS PARAMETER | EXEMPLARY RANGE | PREFERRED RANGE |
|---|---|---|
| SiH$_4$ Flow Rate (sccm) | 0.1-2.0 | 0.4-0.7 |
| NH$_3$ Flow Rate (sccm) | 2-10 | 3-5 |
| N$_2$ Flow Rate (sccm) | 0.3-4 | 1.2-1.8 |
| Temperature (° C.) | 300-500 | 350-450 |
| Low Frequency Bias (kW) | 0-1 | 0.4-0.6 |
| High Frequency Bias (kW) | 0-1 | 0.4-0.6 |
| Thickness (Angstroms) | 200-500 | 280-330 |

Figure 4E:
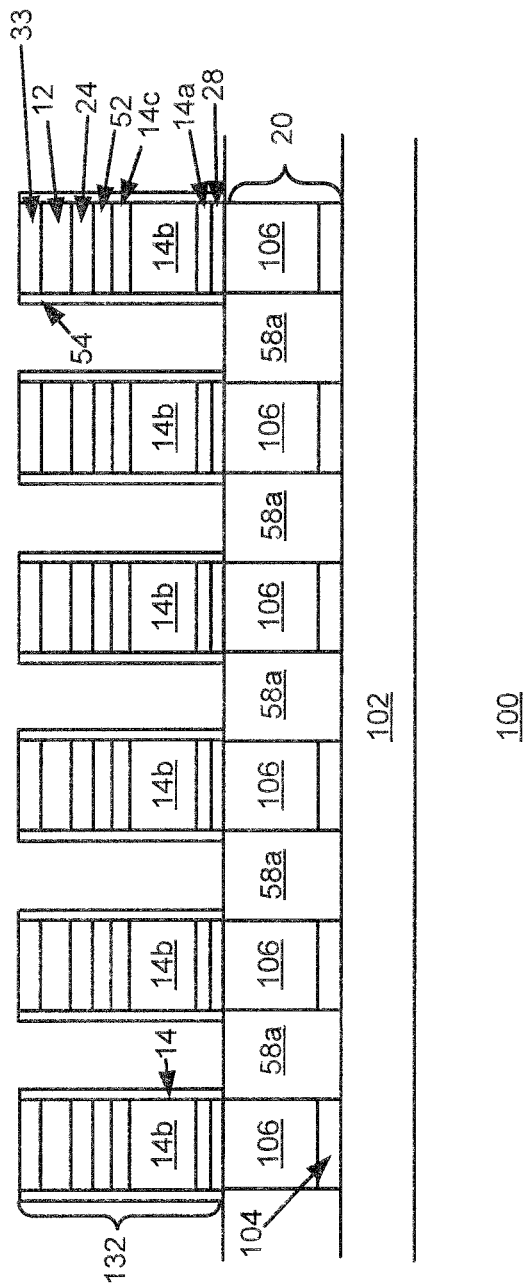
Figure 4F:
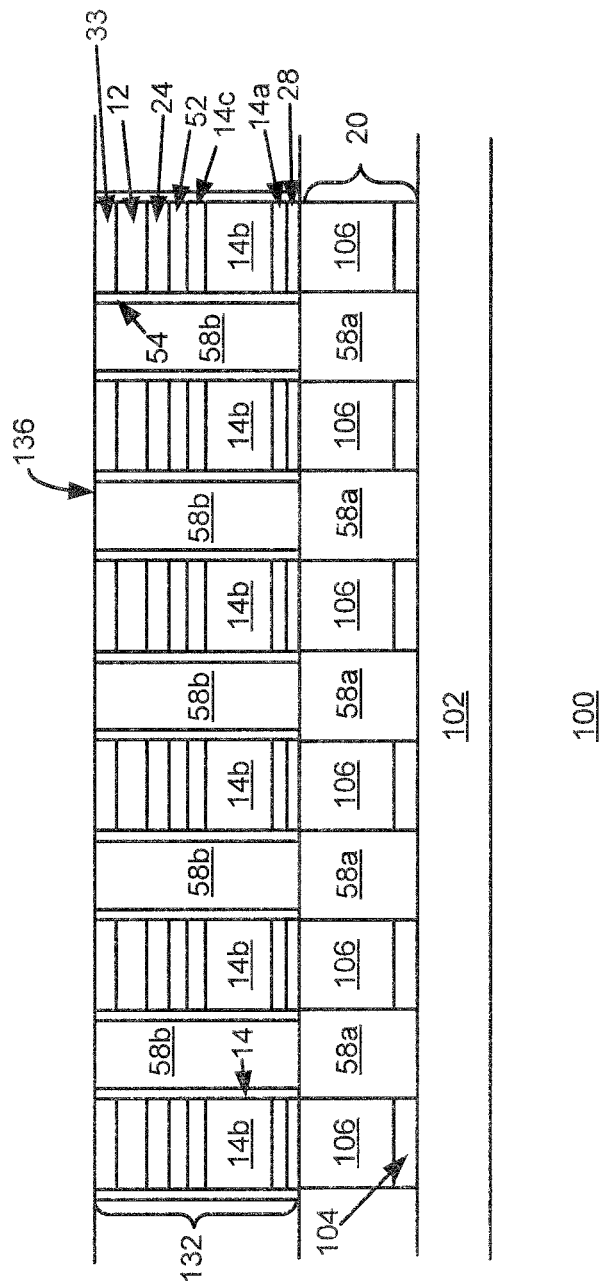

With reference to FIG. 4E, an anisotropic etch is used to remove lateral portions of liner 54, leaving only sidewall portions of liner 54 on pillars 132. For example, a sputter etch or other suitable process may be used to anisotropically etch liner 54.

A dielectric layer 58b is deposited over pillars 132 to fill the voids between pillars 132. For example, approximately 2000-7000 angstroms of silicon dioxide may be deposited and planarized using chemical mechanical polishing or an etchback process to form a planar surface 136, resulting in the structure illustrated in FIG. 4F. Planar surface 136 includes exposed top surfaces of pillars 132 separated by dielectric material 58b (as shown). Other dielectric materials such as silicon nitride, silicon oxynitride, low K dielectrics, etc., and/or other dielectric layer thicknesses may be used.

Figure 4G:
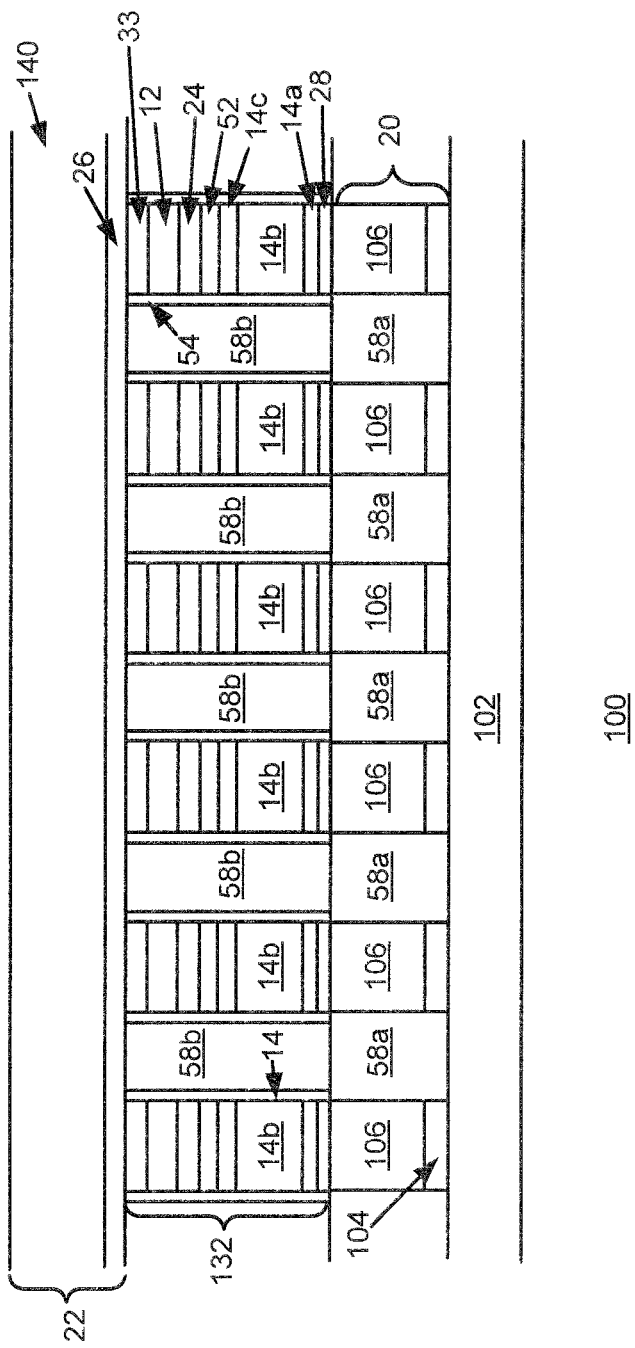

With reference to FIG. 4G, second conductors 22 may be formed above pillars 132 in a manner similar to the formation of first conductors 20. For example, in some embodiments, one or more barrier layers and/or adhesion layers 26 may be deposited over pillars 132 prior to deposition of a conductive layer 140 used to form second conductors 22.

Conductive layer 140 may be formed from any suitable conductive material such as tungsten, another suitable metal, heavily doped semiconductor material, a conductive silicide, a conductive silicide-germanide, a conductive germanide, or the like deposited by PVD or any other any suitable method (e.g., CVD, etc.). Other conductive layer materials may be used. Barrier layer and/or adhesion layer 26 may include titanium nitride or another suitable layer such as tantalum nitride, tungsten nitride, tungsten, molybdenum, combinations of one or more layers, or any other suitable material(s). The deposited conductive layer 140 and barrier and/or adhesion layer 26 may be patterned and etched to form second conductors 22. In at least one embodiment, second conductors 22 are substantially parallel, substantially coplanar conductors that extend in a different direction than first conductors 20.

In other embodiments of the invention, second conductors 22 may be formed using a damascene process in which a dielectric layer is formed, patterned and etched to create openings or voids for conductors 22. The openings or voids may be filled with adhesion layer 26 and conductive layer 140 (and/or a conductive seed, conductive fill and/or barrier layer if needed). Adhesion layer 26 and conductive layer 140 then may be planarized to form a planar surface.

Following formation of second conductors 22, the resultant structure may be annealed to crystallize the deposited semiconductor material of diodes 14 (and/or to form silicide regions by reaction of the silicide-forming metal layer 52 with p+ region 14c). The lattice spacing of titanium silicide and cobalt silicide are close to that of silicon, and it appears that such silicide layers may serve as "crystallization templates" or "seeds" for adjacent deposited silicon as the deposited silicon crystallizes. Lower resistivity diode material thereby is provided. Similar results may be achieved for silicon-germanium alloy and/or germanium diodes.

Thus in at least one embodiment, a crystallization anneal may be performed for about 10 seconds to about 2 minutes in nitrogen at a temperature of about 600 to 800° C., and more preferably between about 650 and 750° C. Other annealing times, temperatures and/or environments may be used.

Additional memory levels may be similarly formed above the memory level of FIGS. 4A-G. Persons of ordinary skill in the art will understand that alternative memory cells in accordance with this invention may be fabricated with other suitable techniques.

The foregoing description discloses only exemplary embodiments of the invention. Modifications of the above disclosed apparatus and methods which fall within the scope of the invention will be readily apparent to those of ordinary skill in the art. For instance, in any of the above embodiments, the carbon-based material may be located below the diode(s) 14.

Accordingly, although the present invention has been disclosed in connection with exemplary embodiments thereof, it should be understood that other embodiments may fall within the spirit and scope of the invention, as defined by the following claims.

The invention claimed is:

1. A method of forming a carbon nano-tube (CNT) memory cell comprising:
    forming a first conductor;
    forming a steering element above the first conductor;
    forming a first conducting layer above the first conductor;
    forming a CNT material above the first conducting layer;
    implanting a selected implant species into the CNT material;
    forming a second conducting layer above the CNT material;
    patterning and etching the first conducting layer, CNT material and second conducting layer to form a metal-insulator-metal (MIM) stack; and
    forming a second conductor above the CNT material and the steering element.

2. The method of claim 1 wherein the steering element comprises a diode.

3. The method of claim 2 wherein the diode comprises a vertical polysilicon diode.

4. The method of claim 1 wherein the MIM stack and steering element are coupled in series.

5. The method of claim 1 wherein at least one of the first and second conducting layers comprises a metal nitride.

6. The method of claim 1 wherein the second conducting layer is formed using physical vapor deposition with a power of about 2000 Watts or more.

7. The method of claim 1 wherein the second conducting layer is formed using physical vapor deposition with a power of about 8000 Watts or more.

8. The method of claim 1 wherein the CNT material has a thickness of about 100 to about 1000 angstroms.

9. The method of claim 1 wherein the selected implant species comprises at least one of N, N$_2$, O, O$_2$, Ar, Kr, Xe, C, Si, P, As, B, F, and Cl.

10. The method of claim 1 wherein implanting the selected species comprises employing an acceleration voltage from about 1 to about 20 KeV.

11. The method of claim 1 wherein implanting the selected species comprises employing an acceleration voltage from about 2 to about 7 KeV.

12. The method of claim 1 wherein implanting the selected species comprises employing an implant dose of about $1\times10^{13}$ to about $1\times10^{20}$ atoms/cm$^2$.

13. The method of claim 1 wherein implanting the selected species comprises employing an implant dose of about $1\times10^{15}$-$5\times10^{15}$ atoms/cm$^2$.

14. The method of claim 1 wherein implanting the selected species comprises employing an implant angle of about 3.5 to about 10 degrees.

15. The method of claim 1 wherein implanting the selected species comprises employing an implant angle of about 5 to about 9 degrees.

16. A memory cell formed by the method of claim 1.

17. A memory level formed by the method of claim 1.

18. A three-dimensional memory array formed by the method of claim 1.

* * * * *